United States Patent [19]
Okazaki et al.

[11] Patent Number: 5,907,900
[45] Date of Patent: Jun. 1, 1999

[54] DEVICE FOR SELECTIVELY USING POSITION DETERMINATION CHUCK OR CAMERA TO CORRECT POSITION OF A COMPONENT FOR MOUNTING ON PRINTED CIRCUIT BOARD

[75] Inventors: Tadao Okazaki; Hideaki Aono, both of Shizuoka, Japan

[73] Assignee: Samsung Aerospace Industries, Ltd., Kyongsangnam-do, Rep. of Korea

[21] Appl. No.: 08/787,328

[22] Filed: Jan. 28, 1997

[30] Foreign Application Priority Data

Jan. 29, 1996 [JP] Japan .................................. 8-012606

[51] Int. Cl.⁶ .................................................. H05K 3/30
[52] U.S. Cl. .............................. 29/740; 29/721; 29/743; 29/760; 250/208.1; 250/559.33; 294/64.1; 901/47
[58] Field of Search ............................ 29/739, 740, 743, 29/760, DIG. 44, 720, 721; 294/64.1, 2; 901/40, 47; 250/208.1, 559.34, 559.33

*Primary Examiner*—Peter Vo
*Assistant Examiner*—Rick Kiltae Chang

*Attorney, Agent, or Firm*—Finnegan, Henderson, Farabow, Garrett & Dunner, L.L.P.

[57] ABSTRACT

A component mounting device mounts electronic components from several component stages on a printed circuit board. The component mounting device includes a mounting head, a camera unit, and a selection unit. The mounting head, movably installed between the component stage and the printed circuit board, includes a suction element and a position determination chuck. The suction element picks up and thereafter supports the component, and the position determination chuck corrects the position of the supported component. The camera unit, installed within a movement range of the mounting head, receives an image of the component supported by the suction element. The selection unit selects either the position determination chuck or the camera unit to correct the position of the component supported by the suction element. The component mounting device selectively corrects the position of the component supported by the suction element by using the position determination chuck or by processing the image received by the camera unit based on the selection by the selection unit.

6 Claims, 8 Drawing Sheets

DEVICE FOR SELECTIVELY USING POSITION DETERMINATION CHUCK OR CAMERA TO CORRECT POSITION OF A COMPONENT FOR MOUNTING ON PRINTED CIRCUIT BOARD

BACKGROUND OF THE INVENTION

The present invention relates to a component mounting device, and more particularly, to a device for automatically mounting electronic components, such as semiconductor devices, on a printed circuit board.

A component mounting device, called a mounter, automatically mounts electronic components, such as semiconductor devices, diodes, capacitors, or resistors, on a printed circuit board. The mounting device includes a board supporting stage having guide rails for guiding the printed circuit board to a predetermined position, a component stage that supports various electronic components to be mounted on the printed circuit board, and a mounting head that moves horizontally to pick up the electronic components from the component stage and mount them at predetermined locations on the printed circuit board.

The mounting head includes several suction nozzles, or suction bits, for picking up the electronic components using vacuum suction. The suction nozzles move up and down with respect to the board supporting stage and the component stage.

The mounting head also includes a position determination chuck, that is, a mechanism that determines the position of the picked-up electronic component held by the suction bit. The position determination chuck assures that the electronic component is positioned at a predetermined position with respect to the suction bit, or in other words, that the suction bit has a proper hold on the electronic component. When the electronic component is not positioned at the predetermined position, the position determination chuck corrects the electronic component's position using a position determination finger.

For electronic components that do not require high precision mounting, the mounting head mounts the electronic components after the position determination chuck determines the position of the electronic components as described above.

Some types of electronic components, however, require high precision mounting. For high precision mounting, the component mounting device uses optical detection to determine whether the picked-up electronic component is positioned at the predetermined position with respect to the suction bit. Typically, the mounting device uses a camera to determine whether the center of the electronic component aligns with the center of the suction bit, and the degree of rotation of the electronic component with respect to the suction bit.

The component mounting device processes the image data received by the camera to detect the amount of deviation of the picked-up electronic component in a horizontal direction with respect to a reference position of the suction bit. Then, as the mounting head carries the picked-up electronic component to a mounting position on the printed circuit board, the mounting head corrects the electronic component's deviation so as to accurately mount the electronic component on the printed circuit board. Position correction using image processing takes more time than other types of position correction, but provides a more accurate position determination.

The camera captures the image of the electronic component using one of several capture techniques: the backlight or transmission type of capture, or the front-light or reflection type of capture. In the backlight type, a light source is located opposite the camera so that the illumination transmits through the electronic component. In the front-light type, on the other hand, the light source is located on the side of the camera so that the illumination reflects off of the electronic component.

Conventionally, the mounting device positions the camera at a bottom portion of the mounting device, and positions the light source in the mounting head. By this arrangement, the camera captures the image of the component through the backlight type of capture. After the suction bit picks up the electronic component, the camera captures the image of the component to determine whether the electronic component is located at the predetermined position with respect to the suction bit.

When the mounting head contains the light source, one of the mounting heads typically acts as a head for image processing only. This reduces the number of suction bits that can be installed in the mounting heads and thereby lowers the component mounting speed and mounting efficiency of the mounting device.

Typically, the mounting device locates the camera at the bottom portion of the mounting device, between the board support stage and the component stage. The camera captures the image of the electronic component while the mounting head carries the electronic component from the component stage to the board support stage. To accommodate the camera being installed between the board support stage and the component stage, however, the component mounting device must be made larger in the horizontal direction. This decreases the mounting speed because the electronic component needs to be carried over a longer distance.

When a position determination chuck is installed at the suction bit and the camera is of the front-light type (reflection type), the camera captures not only an image of the picked-up electronic component, but also the hook, or finger, portion of the position determination chuck. As a result, the mounting device cannot accurately process the captured image.

Moreover, the components, whose picked-up positions are accurately detected by image processing, occupy only a small portion of the electronic components to be mounted on the printed circuit board. Accordingly, the position determination process cannot be accurately performed with respect to a majority of the electronic components.

SUMMARY OF THE INVENTION

To solve the above problems, the present invention provides a component mounting device that mounts electronic components on a printed circuit board faster than conventional devices, thereby improving the component mounting device's mounting efficiency.

To achieve the above objects, the present invention includes a component mounting device that mounts components on a printed circuit board from component stages. The component mounting device includes a mounting head, a camera unit, and a selection unit.

The mounting head, movably installed between the component stage and the printed circuit board, includes a suction element and a position determination chuck. The suction element picks up and thereafter supports the component, and the position determination chuck corrects the position of the supported component. The camera unit, installed within a movement range of the mounting head, receives an image of the component supported by the suction element. The selection unit selects either the position determination chuck or the camera unit to correct the position of the component supported by the suction element.

The component mounting device selectively corrects the position of the component supported by the suction element by using the position determination chuck or by processing the image received by the camera unit based on the selection by the selection unit.

BRIEF DESCRIPTION OF THE DRAWINGS

The accompanying drawings, which are incorporated in and constitute a part of this specification, illustrate an embodiment of the invention and, together with the description, explain the objects, advantages and principles of the invention. In the drawings.

DETAILED DESCRIPTION OF THE INVENTION

The following detailed description of the invention refers to the accompanying drawings that illustrate preferred embodiments consistent with the principles of this invention. Other embodiments are possible and changes may be made to the embodiments without departing from the spirit and scope of the invention. The following detailed description does not limit the invention. Instead, the scope of the invention is defined only by the appended claims.

Figure 1:
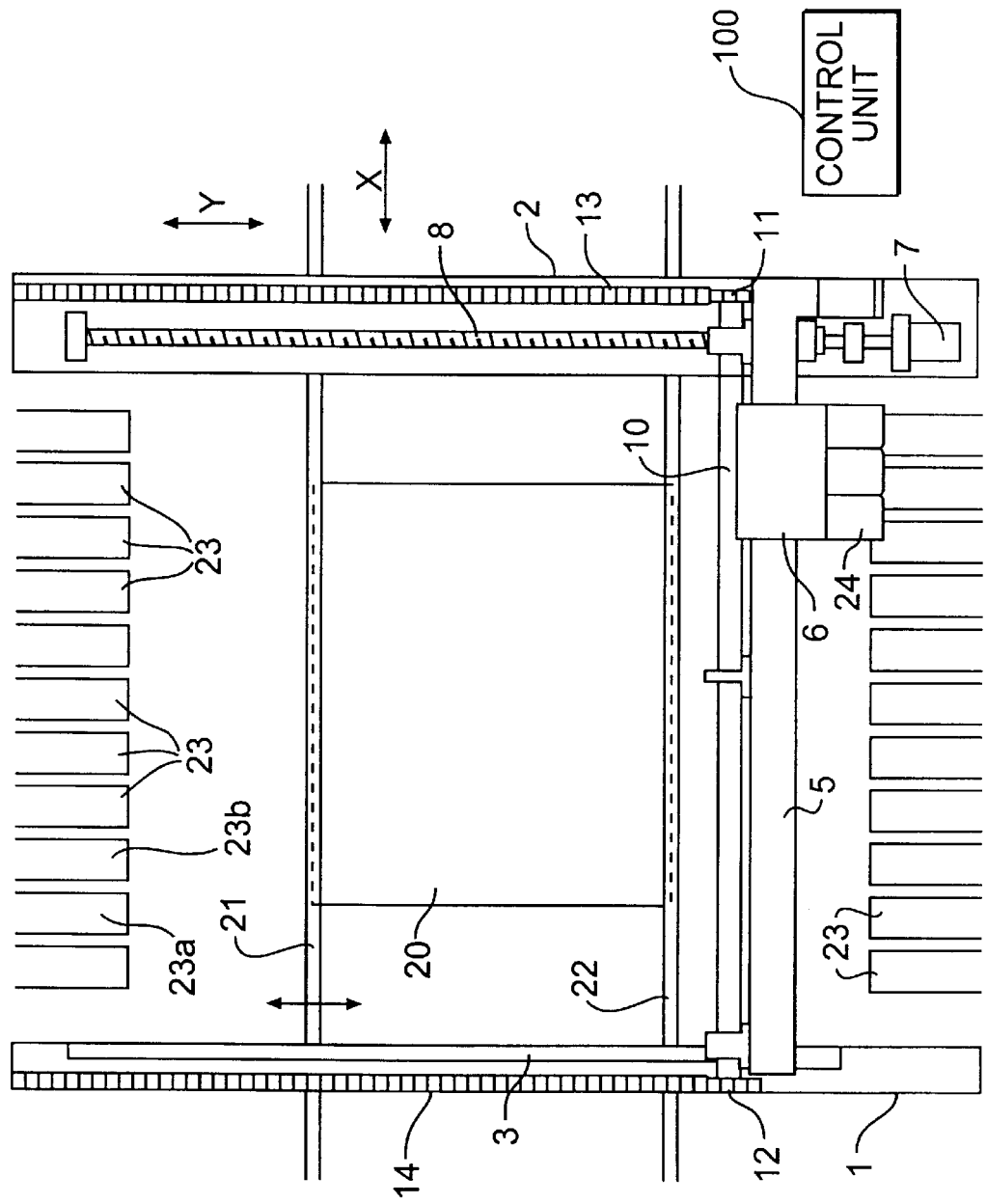
FIG. 1 shows a plan view schematically illustrating the configuration of a component mounting device consistent with the principles of the present invention.
Figure 2:
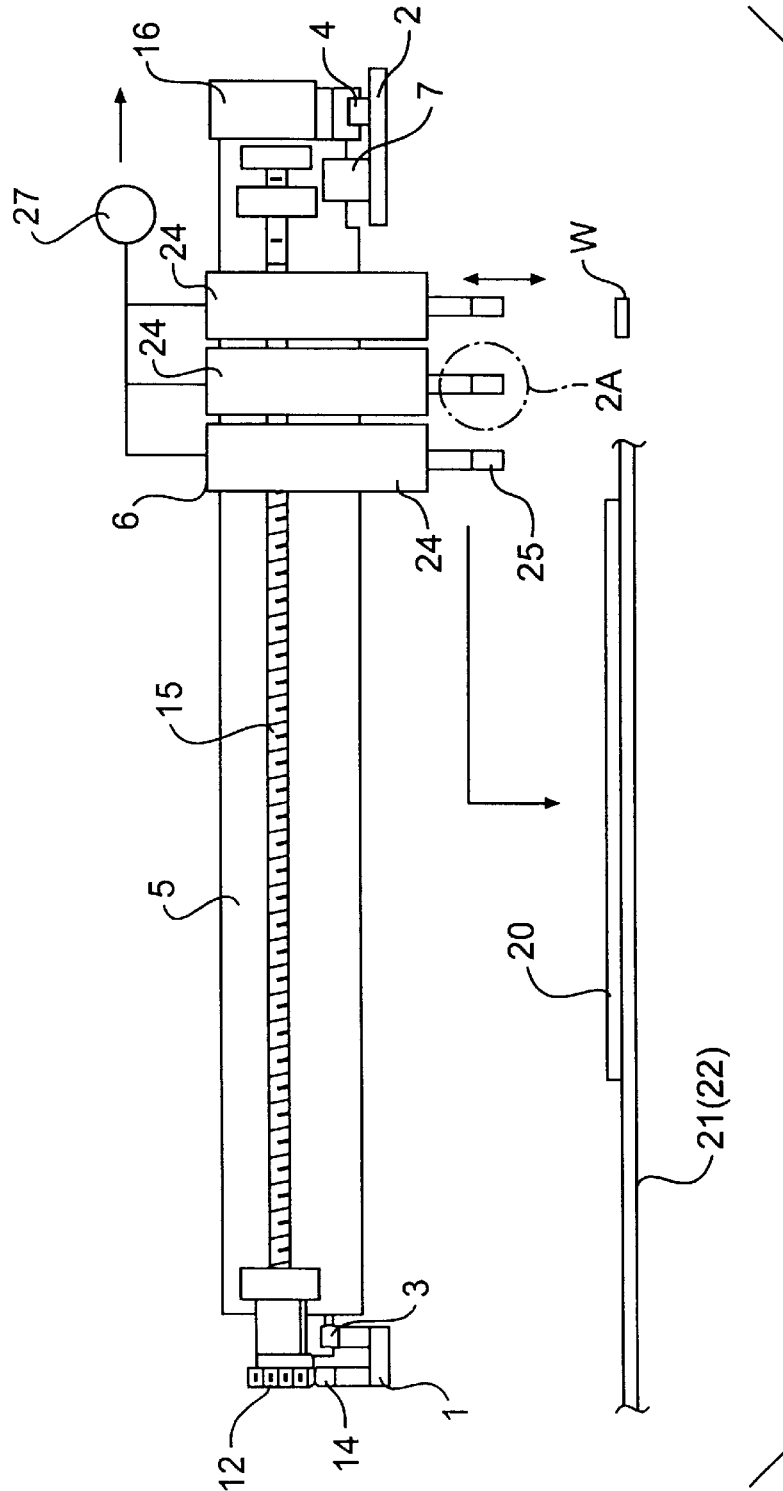
FIGS. 2 and 2A show a front view of the component mounting device of FIG. 1.
Figure 2A:
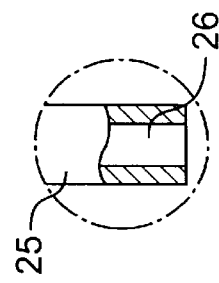

FIG. 1 shows a component mounting device consistent with the principles of the present invention. FIGS. 2 and 2A show a front view of FIG. 1.

The component mounting device includes two horizontal support members 1 and 2 arranged in parallel, and guide rails 3 and 4 attached to horizontal support members 1 and 2, respectively. Cross bar 5 extends perpendicular to horizontal support members 1 and 2 and connects to guide rails 3 and 4 at its ends. Cross bar 5 moves in the Y-direction along horizontal support members 1 and 2, guided by guide rails 3 and 4. Head unit 6, installed on cross bar 5, moves in the X-direction along cross bar 5, guided by cross bar 5.

Motor 7 drives screw shaft 8 to move cross bar 5 in the Y-direction. Screw shaft 8 rotatably connects to horizontal support member 2 and connects to one end portion of cross bar 5 by a screw. Engagement shaft 10, having pinions 11 and 12 coupled to both ends, connects in parallel to cross bar 5. Pinions 11 and 12 engage racks 13 and 14 connected to horizontal support members 2 and 1, respectively. FIGS. 2 and 2A show rack 13 positioned over guide rail 4.

When motor 7 drives screw shaft 8, cross bar 5 moves in the Y-direction, and pinions 11 and 12 rotate within racks 13 and 14, respectively. Pinions 11 and 12 maintain cross bar 5 perpendicular to horizontal support members 1 and 2 as cross bar 5 moves in the Y-direction.

Another screw shaft 15 rotatably connects to cross bar 5 and connects to head unit 6 by a screw. Screw shaft 15 drives head unit 6 in the X-direction. Motor 16 drives screw shaft 15 via a timing belt connecting a pulley (not shown) installed on a shaft of motor 16 and a pulley (not shown) of screw shaft 15.

The component mounting device includes two guide members 21 and 22 at the lower portion of horizontal support members 1 and 2, extending parallel to each other and perpendicular to horizontal support members 1 and 2. Guide members 21 and 22 form a conveyer to carry printed circuit board 20 in the X-direction to a predetermined position of a board support stage. Guide member 21 moves toward or from guide member 22 to adjust to the size of printed circuit board 20.

Component stages 23, located at both sides of the conveyer formed by guide members 21 and 22, support electronic components W to be installed on printed circuit board 20. The component mounting device uses several mounting heads 24 attached to head unit 6 to mount the electronic components W from each component stage 23 onto printed circuit board 20.

FIGS. 2 and 2A show that each mounting head 24 has suction bit 25, that is, a suction nozzle, for picking up electronic components W. Suction bit 25 moves up and down to pick up an electronic component W from component stage 23 and mount the electronic component W at a predetermined position on printed circuit board 20. Cross bar 5 moves in the Y-direction along horizontal support members 1 and 2 and simultaneously mounting head 24 moves in the X-direction along cross bar 5 to position the electronic component W over the predetermined position.

Suction bit 25 lowers to component stage 23 to pick up the electronic component W, then moves up with the picked-up component supported. Suction bit 25 then moves to the predetermined position on printed circuit board 20 via cross bar 5 and mounting head 24. Once the predetermined position is reached, suction bit 25 lowers to mount the electronic component W on printed circuit board 20.

FIGS. 2 and 2A show that suction bit 25 includes hollow hole 26 connected to vacuum pump 27. Vacuum pressure provided from vacuum pump 27 to hollow hole 26 allows suction bit 25 to pick up the electronic component W and hold it against the leading end of suction bit 25.

Figure 3A:
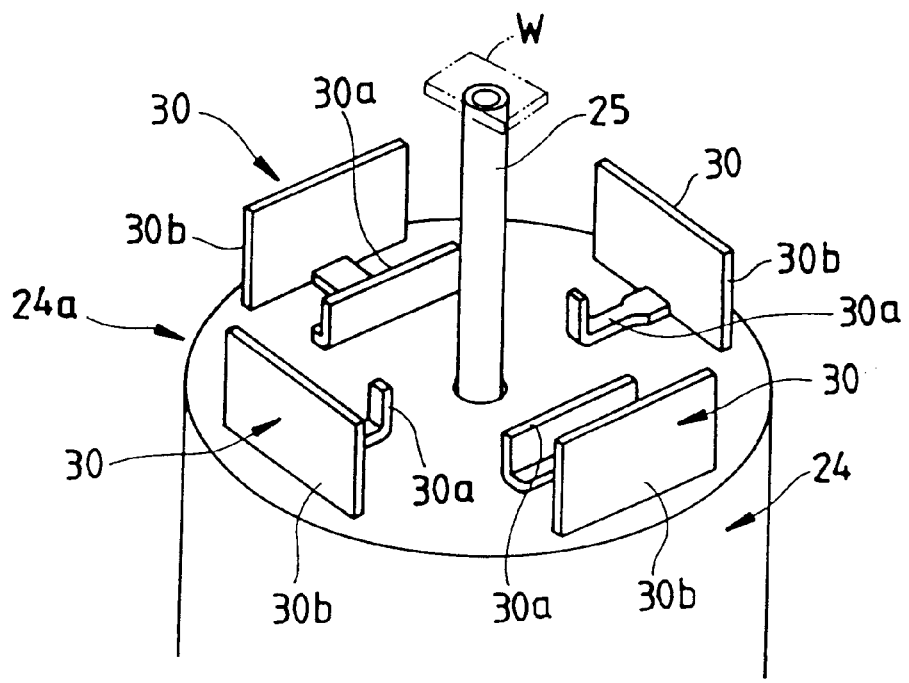
FIGS. 3A and 3B show perspective and plan views illustrating an end tip of a mounting head shown in FIGS. 1, 2 and 2A, respectively.
Figure 3B:
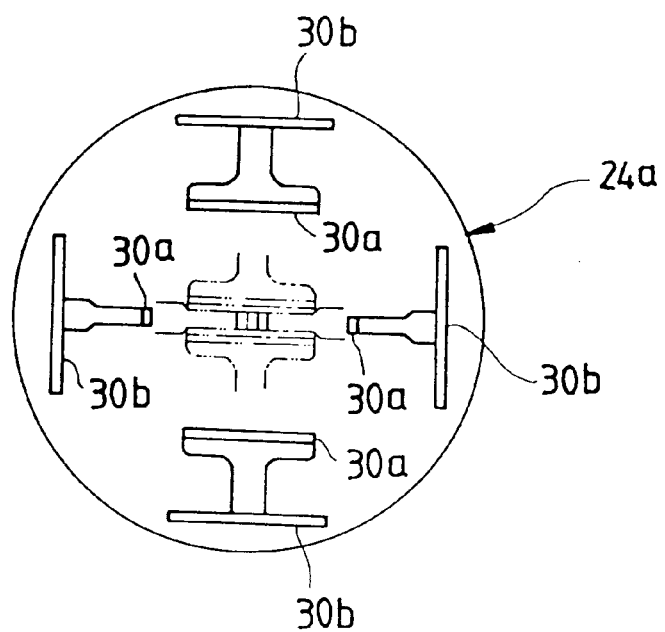
Figure 4:
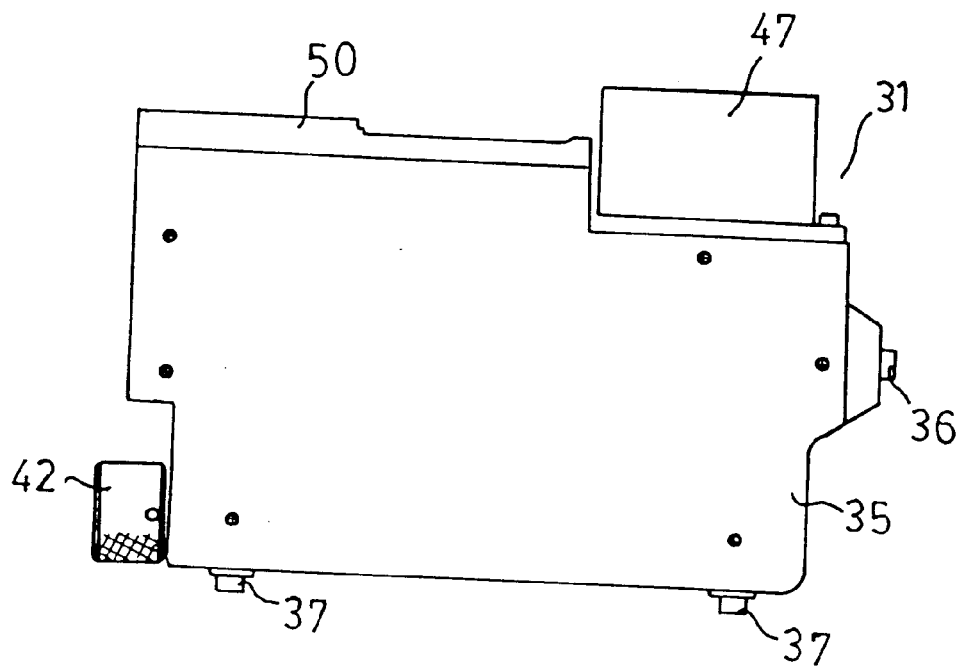
FIG. 4 shows a front view illustrating a camera unit.
Figure 5A:
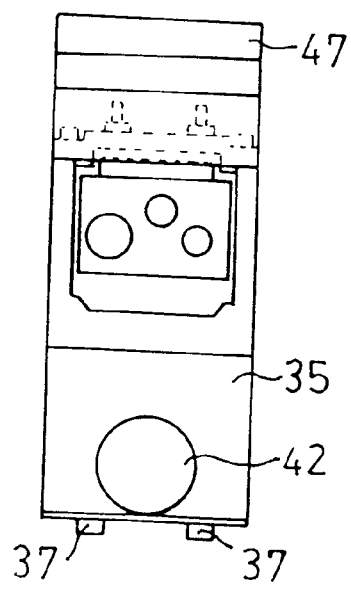
FIGS. 5A and 5B show left and right side views, respectively, of the camera unit of FIG. 4.
Figure 5B:
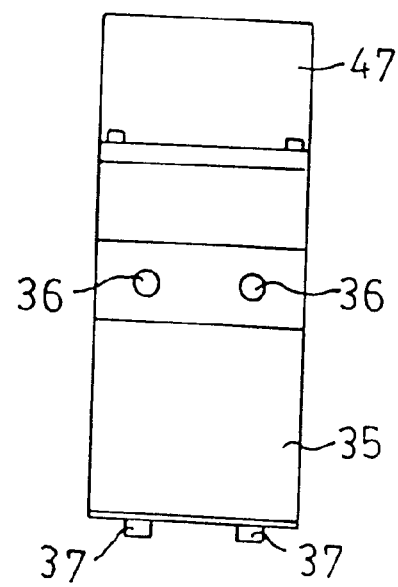

FIGS. 3A and 3B show a position determination device, that is, a position determination chuck 24a, attached to the end of mounting head 24. FIG. 3A shows that suction bit 25 moves up and down within mounting head 24.

Position determination chuck 24a includes position determination fingers 30 installed radially in four directions on mounting head 24, surrounding suction bit 25. Position determination fingers 30 include inner hook 30a for small components and an outer hook 30b for large components.

FIG. 3B shows that each position determination finger 30 moves radially toward/from suction bit 25. Position determination chuck 24a also moves, but up and down along with mounting head 24.

After suction bit 25 picks up and supports the electronic component W, suction bit 25 retreats into mounting head 24. Sometimes, the picked-up electronic component W may be at a position other than the center of suction bit 25, or may be rotated. This can lead to fall-off or incorrect mounting of the electronic component W.

To combat this problem, each position determination finger 30 of position determination chuck 24a moves radially toward suction bit 25, as suction bit 25 retreats into mounting head 24. As a result, position determination fingers 30 adjust the position of the electronic component W to position the electronic component W at the center of suction bit 25 and to correct for any rotation deviation.

FIG. 1 shows several component stages 23 located at either side of the conveyer formed by guide members 21 and 22. Each component stage 23 includes a component cartridge (not shown) in the form of a rolled adhesive tape having electronic components W adhered thereto at predetermined distances. Alternatively, component stages 23 might include trays supporting the electronic components W according to their type.

Figure 6:
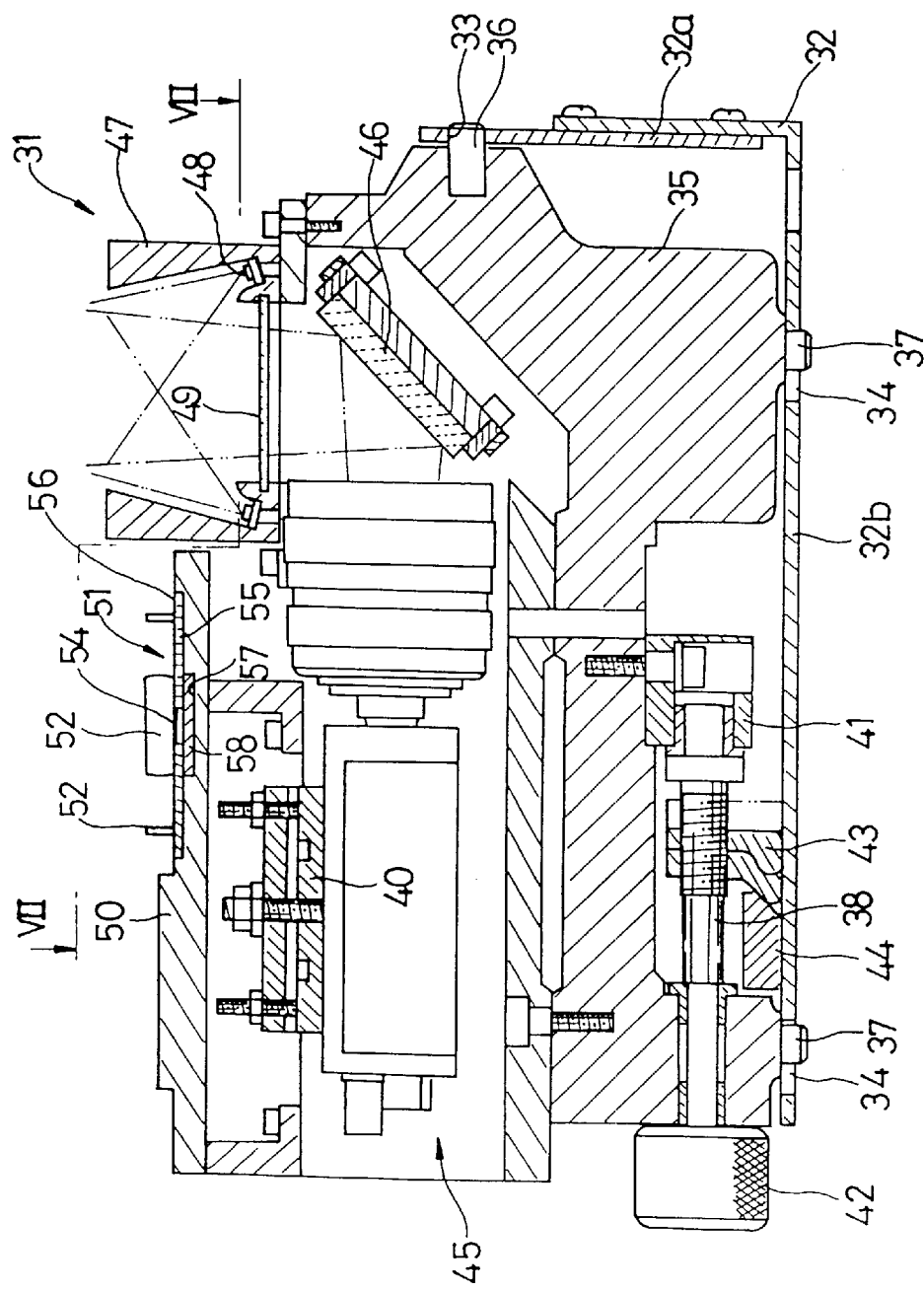
FIG. 6 shows a vertical sectional view of the camera unit of FIG. 4.
Figure 7:
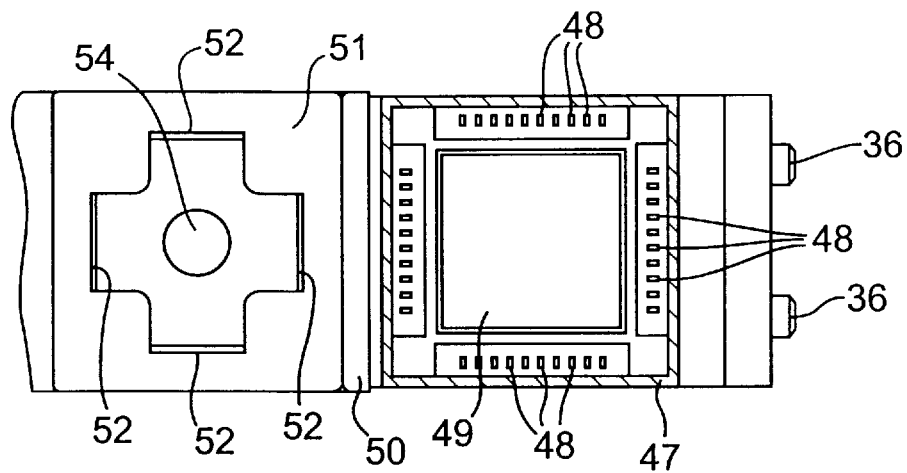
FIG. 7 shows a view taken along line VII—VII in FIG. 6.

FIGS. 4–7 show camera unit 31 mounted at an arbitrary position in component stages 23 instead of the component cartridge. FIG. 6 shows that a component stage 23a (FIG. 1) includes a support frame 32 having vertical and horizontal portions 32a and 32b with attachment holes 33 and attachment slots 34 respectively formed therein. Body 35 of camera unit 31 includes position determination pin 36 installed on the side surface of body 35 for insertion into attachment hole 33, and other position determination pins 37 installed on the bottom surface of body 35 for insertion into attachment slot 34.

In order to detachably install camera unit 31 to support frame 32, body 35 includes coupling screw 38 rotatably attached thereto. Coupling screw 38 has one end supported by support member 41, which connects to body 35 by a screw, and the other end connected to knob 42. Coupling nut 43 rotatably connects to coupling screw 38 so as to be hooked and unhooked by coupling member 44. Coupling member 44, formed from a bar-shaped member attached to component stages 23, securely attaches to support frame 32.

To couple camera unit 31 to support frame 32, coupling nut 43 first moves to the position indicated by the dotted line in FIG. 6 by rotating knob 42 in the forward direction. Then, after inserting position determination pins 36 and 37 into attachment hole 33 and attachment slot 34, respectively, coupling nut 43 moves to a position indicated by the solid line shown in FIG. 6 by rotating knob 42 in the reverse direction, thereby securing camera unit 31 to support frame 32. To detach camera unit 31 from support frame 32 merely requires rotating knob 42 in the forward direction again.

Camera unit 31 also includes camera 45 having a lens-rotating unit and an image-receiving unit attached to pedestal unit 40. Mirror 46, located in front of the lens-rotating unit of camera 45, reflects the image of the electronic component W received by the image-receiving unit at an angle of 90°.

Camera unit 31 includes image-guiding member 47 corresponding to mirror 46, light sources 48 formed by LEDs arranged at the inner circumference of the lower portion of image-guiding member 47, and dust-proof glass 49. By such an arrangement, the position of the electronic component W (FIG. 2) with respect to suction bit 25 can be detected by locating the electronic component W picked up by suction bit 25 above image-guiding member 47. Dust-proof glass 49 prevents dust from settling on mirror 46 to ensure that camera 45 receives a clear image.

Figure 8A:
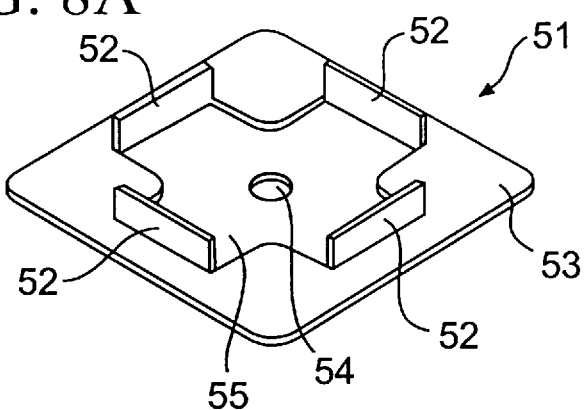
FIGS. 8A and 8B show perspective and sectional side views, respectively, of a light-shielding cover.
Figure 8B:
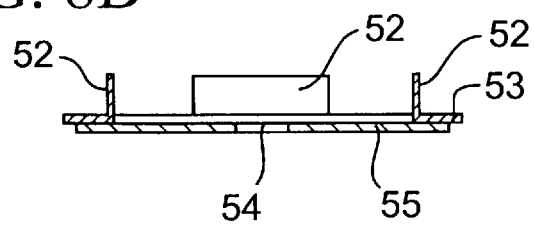

Tool plate 50, attached to camera unit 31, has light-shielding cover 51 located thereon. FIGS. 8A and 8B show that light-shielding cover 51 includes hook attachment panel 53 having four hook fingers 52, and light-shielding panel 55 having hole 54. Panels 53 and 55 connect forming one body.

FIG. 6 shows recess portion 56 formed in tool plate 50 for receiving light-shielding cover 51, and cap-receiving indent 57 formed at the center portion of recess portion 56. Cap 58, located in cap-receiving indent 57, provides a means for lifting up light-shielding cover 51 when light-shielding cover 51 is installed at mounting head 24.

Next, the operation of the component mounting device consistent with the principles of the present invention will be described with reference to FIGS. 9A through 9D and 10A through 10D. To facilitate the description that follows, component stage 23a (FIG. 1) contains camera unit 31.

Figure 9A:
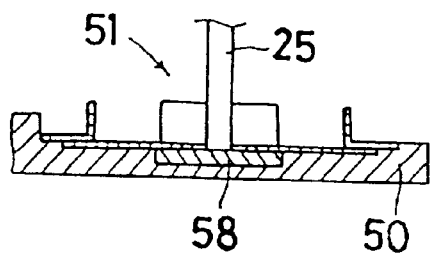
FIGS. 9A through 9D show sectional views to facilitate description of the sequence of picking up the component by a suction bit consistent with the principles of the present invention.

In FIGS. 9A through 9D, mounting head 24, installed in head unit 6 (FIGS. 1 and 2), moves above light-shielding cover 51 on tool plate 50. To make this possible, cross bar 5 (FIG. 1) moves in the Y-direction and simultaneously head unit 6 moves in the X-direction. FIG. 9A shows that once mounting head 24 reaches component stage 23a, suction bit 25 of mounting head 24 descends and contacts the surface of cap 58. Suction bit 25 picks up cap 58 using the vacuum pressure from vacuum pump 27 (FIG. 2).

Figure 9B:
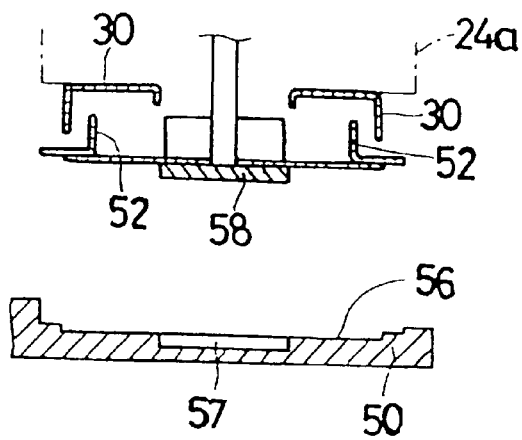
Figure 9C:
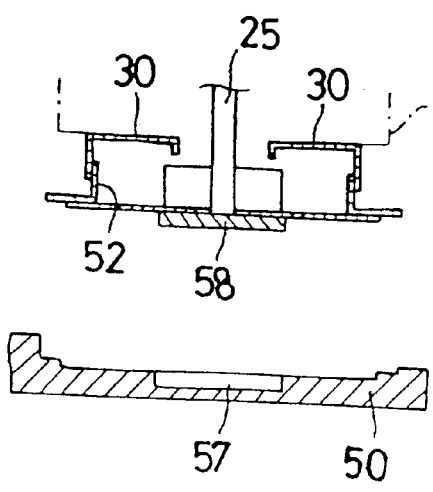

FIG. 9B shows that while suction bit 25 retreats upward, light-shielding cover 51 lifted by cap 58 ascends toward position determination chuck 24a. FIG. 9C shows that when position determination fingers 30 contact hook fingers 52 of light-shielding cover 51, position determination chuck 24a grips light-shielding cover 51 using position determination fingers 30.

Figure 9D:
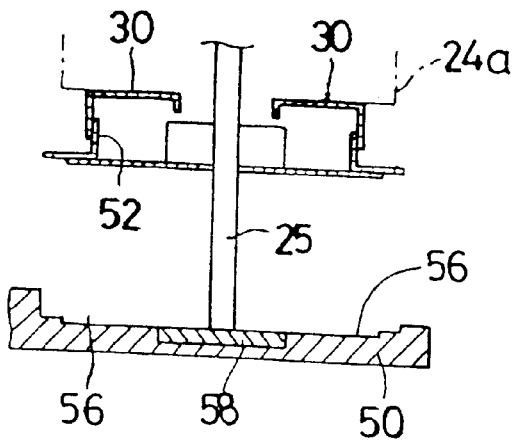

FIG. 9D shows that once position determination chuck 24a has hold of light-shielding cover 51, suction bit 25 descends to cap-receiving indent 57 of the tool plate 50. Suction bit 25 then releases cap 58 by stopping the suction of vacuum pump 27. This completes the installation of light-shielding cover 51 to the lower portion of position determination chuck 24a on mounting head 24.

Figure 10A:
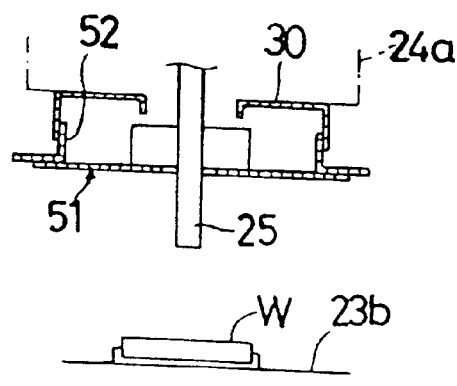
FIGS. 10A through 10D show sectional views to facilitate description of the sequence of mounting the component on a printed circuit board consistent with the principles of the present invention.
Figure 10B:
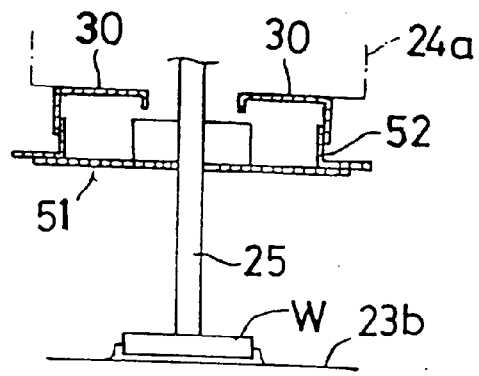

After suction bit 25 moves upward or while moving upward, suction bit 25 moves horizontally over component stage 23b (FIG. 1) via head unit 6. FIG. 10A shows suction bit 25 located directly over an electronic component W of component stage 23b. FIG. 10B shows that suction bit 25 descends to a point such that the end tip of suction bit 25 contacts a surface of the electronic component W. Once in this position, suction bit 25 picks up the electronic component W using the vacuum pressure of vacuum pump 27.

Figure 10C:
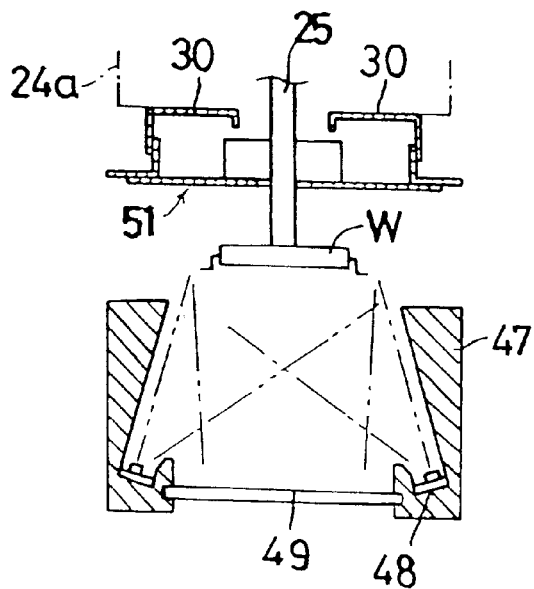

After suction bit 25 moves upward or while moving upward supporting electronic element W, suction bit 25 moves horizontally over camera unit 31 installed at component stage 23a. FIG. 10C shows that suction bit 25 positions the picked-up electronic component W directly above image-guiding member 47. Once in this position, camera 45, being of a front-light type, operates to receive an image of the electronic component W. Because light-shielding cover 51 covers position determination fingers 30, camera 45 receives image data relating only to the electronic component W. The bottom surface of light-shielding cover 51 is preferably black and non-polished so as to not reflect the light from light sources 48.

Camera 45 records the amount that the electronic component W deviates from the center of suction bit 25. The component mounting device processes the image data to calculate a correction value for the electronic component W with respect to the mounting position on printed circuit board 20. In accordance with the correction value, the component mounting device adjusts the movement of mounting head 24 in the X and Y directions and simultaneously adjusts the rotation of suction bit 25.

Figure 10D:
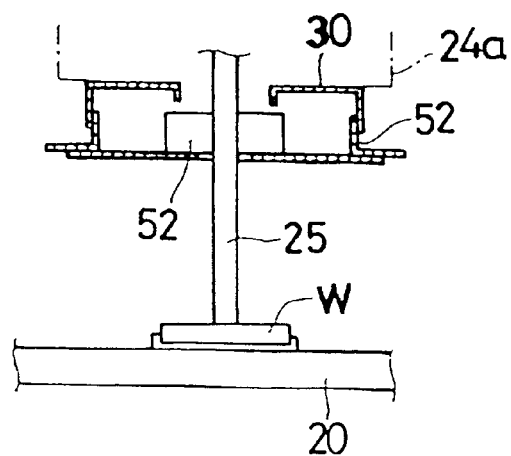

FIG. 10D shows the electronic component W moved directly above printed circuit board 20 according to the corrected value. Suction bit 25 descends to mount the electronic component W at a predetermined position on printed circuit board 20. After mounting the electronic component W, the component mounting device mounts other components using camera 45 with light-shielding cover 51 gripped by position determination fingers 30.

When mounting an electronic component W without using camera 45, mounting head 24, having light-shielding cover 51 gripped by position determination finger 30, returns light-shielding cover 51 to recess portion 56 of tool plate 50. The component mounting device performs the process of returning the light-shielding cover 51 to recess portion 56 in the reverse order to that given in FIGS. 9A through 9D. In other words, suction bit 25 picks up cap 58 located on cap-receiving indent 57 (FIG. 9D). Suction bit 25 then retreats until cap 58 contacts light-shielding cover 51 (FIG. 9C). Position determination fingers 30 of position determination chuck 24a release hook fingers 52 (FIG. 9B). Suction bit 25 then descends to simultaneously put cap 58 on cap-receiving indent 57 and light-shielding cover 51 on recess portion 56 (FIG. 9A).

When mounting an electronic component W on printed circuit board 20 without using camera 45, position determination chuck 24a corrects any deviation in the position of the electronic component W supported by suction bit 25. The four position determination fingers 30 of position determination chuck 24a move toward the electronic component W. In this way, position determination chuck 24a corrects deviations in the position and the rotation of the electronic component W by pressing against the electronic component W at its four sides using position determination fingers 30.

After or while correcting the position, mounting head 24 moves horizontally to a predetermined position on printed circuit board 20. Then suction bit 25 descends to accurately mount the electronic component W on printed circuit board 20.

When mounting an electronic component W, the control unit 100 (FIG. 1) determines according to the type of the electronic component W whether to correct the mounting position of the electronic component W using camera 45 to receive the image data of the electronic component W, or to mechanically correct the position of the electronic component supported by suction bit 25 using position determination chuck 24a. Preferably, an operator selects the type of correction by manipulating a control panel for controlling the operation of the component mounting device according to the type of electronic component W.

Locating the camera unit and the light source at a bottom portion of the component mounting device opposite the mounting head, but within a range of horizontal movement of the mounting head, eliminates the need for a head installed for image processing only. Thus, the saved space can be used for an additional mounting head, thereby improving the efficiency of the mounting process.

Mounting the camera unit at one side of the component stages eliminates the need to install a camera unit between the component stage and the board supporting stage. Thus, the size of the component mounting device can be reduced, and the mounting efficiency can be improved since the movement distance of the mounting head is shortened.

The present invention improves the mounting efficiency of the component mounting device by correcting the position of the component using the position determination fingers while the suction bit supports the component. Moreover, by supporting the light-shielding cover using the position determination fingers, the camera, being of a front-light type, receives a highly accurate image of the component because the background image is completely removed.

The present invention permits selection of the method of correcting the component position by using either the position determination fingers or the camera, thereby improving the efficiency in mounting the component on the printed circuit board according to the type of component.

The foregoing description of preferred embodiments of the present invention provides illustration and description, but is not intended to be exhaustive or to limit the invention to the precise form disclosed. Modifications and variations are possible in light of the above teachings or may be acquired from practice of the invention. The scope of the invention is defined by the claims and their equivalents.

What is claimed is:

1. A component mounting device for mounting components from a plurality of component stages on a printed circuit board, said component mounting device comprising:

a mounting head, movably installed between said component stage and said printed circuit board, including suction means for picking up and supporting a component, and a position determination chuck for correcting a position of the supported component;

a camera unit, installed within a movement range of said mounting head, for receiving an image of the component supported by said suction means, a selection unit for selecting one of said position determination chuck and said camera unit to correct the position of the component supported by said suction means; and a light-shielding cover, located within the movement range of said mounting head, for being picked up by said suction means and gripped by said position determination chuck to correct the position of said component when said selection unit selects said camera unit, wherein the component mounting device selectively corrects the position of the component supported by said suction means by using one of said position determination chuck and said camera unit based on the selection by said selection unit.

2. The component mounting device as claimed in claim 1, further comprising a cap for supporting said light-shielding cover, said suction means picks up and lifts said cap so as to grip said light-shielding cover using said position determination chuck.

3. The component mounting device as claimed in claim 1, wherein said camera unit includes a tool plate for supporting said light-shielding cover.

4. The component mounting device as claimed in claim 1, further comprising means for processing the image received by said camera unit to correct deviations in position and rotation of the picked up component.

5. The component mounting device as claimed in claim 1, wherein said position determination chuck includes finger means for moving toward said picked up component and pressing against sides of the picked up component to correct deviations in position and rotation of the component.

6. The component mounting device as claimed in claim 1, wherein said camera unit comprises a camera, an image receiving portion for receiving the image of the component, and a mirror for forming an optical path between said image receiving portion and said camera.

* * * * *